(12) United States Patent
Mao et al.

(10) Patent No.: US 6,559,245 B2
(45) Date of Patent: May 6, 2003

(54) PHOTOIMAGEABLE, AQUEOUS ACID SOLUBLE POLYIMIDE POLYMERS

(75) Inventors: Guoping Mao, Austin, TX (US); Nanayakkara L. D. Somasiri, Austin, TX (US); Nicholas A. Stacey, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 120 days.

(21) Appl. No.: 10/038,270

(22) Filed: Jan. 3, 2002

(65) Prior Publication Data

US 2002/0086236 A1 Jul. 4, 2002

Related U.S. Application Data

(62) Division of application No. 09/547,390, filed on Apr. 11, 2000, now Pat. No. 6,379,865.

(51) Int. Cl.[7] .............................................. C08F 283/04
(52) U.S. Cl. ..................................................... 525/420
(58) Field of Search ........................... 525/420; 522/905

(56) References Cited

U.S. PATENT DOCUMENTS

| | | | |
|---|---|---|---|
| 3,892,646 A | | 7/1975 | Lazzarini et al. ............. 204/181 |
| 3,974,324 A | * | 8/1976 | Lupinski et al. .............. 428/458 |
| 4,592,816 A | | 6/1986 | Emmons et al. .............. 204/180 |
| 4,629,685 A | | 12/1986 | Pfeifer ......................... 430/583 |
| 4,656,116 A | | 4/1987 | Rohde et al. ................. 430/197 |
| 4,676,854 A | | 6/1987 | Suzuki et al. ................. 156/151 |
| 4,696,890 A | * | 9/1987 | Pfeifer ......................... 430/325 |
| 4,832,808 A | | 5/1989 | Buchwalter ................ 204/181.7 |
| 4,844,784 A | | 7/1989 | Suzuki et al. ............... 204/180.9 |
| 4,845,012 A | | 7/1989 | Seko et al. ................... 430/287.1 |
| 4,877,818 A | | 10/1989 | Emmons et al. ............... 522/26 |
| 4,914,182 A | | 4/1990 | Pfeifer et al. ................. 528/353 |
| 4,925,912 A | | 5/1990 | Rohde et al. ................. 528/226 |
| 5,055,164 A | | 10/1991 | Hawkins et al. ............... 204/15 |

(List continued on next page.)

FOREIGN PATENT DOCUMENTS

| | | | |
|---|---|---|---|
| EP | 3 337 698 | 4/1989 | |
| EP | 0 341 028 | 5/1989 | |
| EP | 0 348 092 B1 | 6/1989 | |
| EP | 0 407 951 A2 | 7/1990 | |
| EP | 0 449 022 A2 | 3/1991 | |
| EP | 0 456 469 A2 | 5/1991 | |
| EP | 0 456 463 A2 | 11/1991 | ........... G03F/7/038 |
| EP | 0 535 444 A1 | 9/1992 | |
| JP | P2000-4072 A | 1/2000 | |

OTHER PUBLICATIONS

Abstract—2001 Derwent Info Ltd—JP2000223822 A.

*Primary Examiner*—Cynthia Hamilton
(74) *Attorney, Agent, or Firm*—Alan Ball

(57) ABSTRACT

A photoimageable, aqueous acid soluble polyimide polymer comprising an anhydride, including a substituted benzophenone nucleus, a diamine reacted with the anhydride to form a photosensitive polymer intermediate, and at least 60 Mole % of solubilizing amine reacted with the photosensitive polymer intermediate to form the photoimageable, aqueous acid soluble polyimide polymer. An emulsion for electrophoretic deposition of a coating of a photoimageable, aqueous acid soluble polyimide polymer comprises a dispersed phase, including the photoimageable aqueous acid soluble polyimide polymer, dissolved in an organic solvent and a dispersion phase including a coalescence promoter and water. The emulsion may be applied, by electrophoretic deposition, to a conductive structure to provide a photoimageable coating on the conductive structure. After exposing the coating to a pattern of radiation for photocrosslinking exposed parts of the photoimageable aqueous acid soluble polyimide polymer, an aqueous acid developer solution removes unexposed photoimageable aqueous acid soluble polyimide polymer to reveal a crosslinked polyimide polymer image of the radiation pattern.

3 Claims, 1 Drawing Sheet

U.S. PATENT DOCUMENTS

| | | | |
|---|---|---|---|
| 5,181,984 A | 1/1993 | Matsumura et al. | 156/630 |
| 5,187,241 A | 2/1993 | Buchwalter et al. | 525/420 |
| 5,384,229 A | 1/1995 | Pai et al. | 430/270.1 |
| 5,427,862 A * | 6/1995 | Ngo et al. | 428/435 |
| 5,439,774 A | 8/1995 | Iwasawa et al. | 430/190 |
| 5,501,941 A | 3/1996 | Ngo | 430/270.1 |
| 5,504,830 A | 4/1996 | Ngo et al. | 385/123 |
| 5,532,110 A | 7/1996 | Ngo | 430/275.1 |
| 5,599,655 A | 2/1997 | Ngo | 430/235 |
| 5,607,818 A | 3/1997 | Akram et al. | 430/311 |

* cited by examiner

PHOTOIMAGEABLE, AQUEOUS ACID SOLUBLE POLYIMIDE POLYMERS

This is a divisional of application Ser. No. 09/547,390 filed Apr. 11, 2000.

FIELD OF THE INVENTION

This invention relates to coating formulations and a method, useful in microelectronics applications, for isolating and protecting fine-pitch, electrically conducting circuit interconnects, and related structures. More particularly the invention provides coating materials for application to conductive elements using an electrophoretic deposition technique. The coatings provide protective, high resistivity, low dielectric constant, negative image bearing layers after exposure to radiation patterns of suitable wavelength, followed by development with mild aqueous acid solutions.

BACKGROUND TO THE INVENTION

Modem society relies upon the trouble-free conveniences provided by electrical and electronic devices. Since the earliest recognition that useful devices could be developed by combining electrical circuits, circuit combinations have become more complex, and the resulting devices more sophisticated in their capabilities. Effective circuit performance relies upon electrical current isolation within a particular circuit with no possibility of current leakage into a neighboring circuit. Any unintended current transfer between circuits of a multi-circuit, multi-function electrical device will ultimately cause an inconvenient malfunction of the device.

Isolation or insulation of circuits from each other represents an increasing challenge with the continuing emphasis on more complex printed circuit designs and increased functionality for electrical devices, especially miniature electronic devices. Progress in electrical device design has caused a transition from the interconnection of discrete electrical components, using pre-insulated wiring structures, to interconnection, with modem printed circuits, using conductive traces only microns wide. Protection and isolation of such narrow traces, from each other, demands materials that may be precisely placed over the elongate current carrying traces while leaving tiny contact points exposed for electrical connection to other circuits that form part of a particular device. For a significant period of time it was possible to essentially cover the printed circuit with a protective coating, leaving voids in the coating corresponding to the needed points of contact. More recently, however, the introduction of flexible printed circuits and multi-layer printed circuits has led to the need for coatings and processes capable of high precision in protective cover formation and placement. High precision techniques provide a cover-layer with essentially just sufficient insulation to protect a conductive trace without straying into other portions of a printed circuit substrate. Such coatings tend to be very thin and subject to attack by, e.g. solvents, moisture, or other potentially damaging environments. For this reason, precision coating of printed circuits must provide both insulative and environmental protection for electrical conductors.

A variety of coating methods exists for applying coatings, covercoats and the like as protective, insulating coatings to printed circuit patterns. The term covercoat refers to a dielectric coating, over the printed circuit basestock, applied after the conductive circuit pattern has been etched. The covercoat serves to protect the copper conductors from moisture, contamination and damage. Conventional coating methods include screen printing and application of continuous layers by methods such as knife coating, spin coating, extrusion coating, dip coating, curtain coating, and spray coating. Application of continuous coatings covers not only the leads but also the area in between the leads. This condition has several disadvantages when found in intricately structured printed circuits. For example, differences in expansion coefficients between a continuous cover-coat and a flexible printed circuit substrate may introduce stresses that cause the circuit to adopt an inconvenient curl-set. Segmentation of a cover-coat, into separate coated areas, is less likely to be subject to this condition.

Selective deposition processes, such as electrophoretic deposition, also known as "e-coat," may achieve coating separation and precise positioning (details of this process may be found in the "Handbook of Electropainting Technology" by W. Machu, Electrochemical Publication Limited, 1978). Application of electrophoretic deposition techniques began at least three decades ago for painting automobiles and appliances. Electrophoretic deposition involves precise distribution of a layer of charged droplets over a conducting surface that represents an electrode of an electrolytic cell operating under direct current potential. Charged droplets migrate towards an oppositely charged electrode to be deposited thereon. Droplet deposition and layer formation may occur at either an anode or a cathode. Preferably the droplets are positively charged for deposition on a cathodic surface. Cathodic coatings do not suffer the oxidative corrosive processes associated with anodic deposition. Also, electrophoretic deposition of water-based compositions produces essentially void free and substantially non-polluting coatings.

Compared to conventional coating processes, such as screen printing, electrophoretic deposition selectively places a protective layer only on conductive portions of the printed circuit. Use of electrophoretic deposition should produce individually encapsulated conductors, whereas conventional techniques coat the entire printed circuit. Selective deposition also offers other advantages, such as the production of lighter weight circuits which is important for hard disk drive (HDD) flexible circuits applications.

The use of electrophoretic deposition is known for coating printed circuits with photoresists. U.S. Pat. Nos. 4,845,012; 5,055,164; 5,607,818; 5,384,229; 5,959,859; and 5,439,774 contain reference to the technique. Other U.S. Pat. Nos. 4,592,816 and 5,181,984 describe epoxy/acrylate compositions for electrophoretic deposition of solder mask/covercoat systems. Photoresist and solder mask materials are typically photosensitive and developable to a patterned polymer, covering selected (imaged) portions of the printed circuit. This provides evidence of photoimageable coatings, formed by electrophoretic deposition. Additionally, U.S. Pat. No. 4,832,808 teaches electrophoretic deposition of coatings of piperazine-containing polyimides. However, such coatings possess neither photosensitivity nor solubilization in aqueous acid developers.

The effective use of electrophoretically deposited, photoimageable coatings may depend upon the image resolution attainable with such systems. Printed circuits of increasing density require the use of photoresists of increasing image resolution. Image resolution depends upon radiation scattering within photosensitive layers and the variation of image characteristics, i.e. resolution, related to developers and development processes.

Polyimide-containing formulations provide potentially useful materials for photoimageable coatings produced by electrophoretic deposition. They also have the thermal and dielectric properties suitable for protecting and insulating electrical current carrying conductors. Image development of polyimide coatings, after exposure to an image pattern, may involve non-aqueous, solvent-based developers or aqueous-based developers. The use of solvent-based development systems applies to photoimageable polyimides that may use a benzophenone moiety as a built-in photo-crosslinker. U.S. Pat. Nos. 4,629,685; 4,656,116; 4,841,233; 4,914,182; 4,925,912; 5,501,941; 5,504,830; 5,532,110; and 5,599,655; and European Patent No. EP 0456463 A2 provide evidence of autosensitized polyimides. As indicated previously, these materials need organic solvents for image development. High volume use of solvent developers, in production operations, may cause environmental problems associated with solvent pollution and disposal. Aqueous developers provide a more environmentally friendly alternative to organic solvent developers. Some alkaline aqueous developers contain tetramethylammonium hydroxide as an agent for image development of photoimageable polyimides derived from either polyamic acid or phenolic derivatives. These precursors tend to produce polyimides having residual reactivity, leading to copper oxide formation, when deposited on copper, along with related corrosion of metallic copper that could result in poor coated film properties.

Considering the disadvantages of previously discussed, solvent-based and alkaline aqueous image developers and the benefits of selective coating deposition processes, there is a need for electrophoretically deposited, photoimageable polyimide coatings, soluble in non-polluting, preferably aqeous image developers.

SUMMARY OF THE INVENTION

The present invention provides photoimageable polyimide coatings applied from emulsion or solution formulations using electrophoretic deposition techniques. Such coatings function as image recording materials through exposure to a pattern of suitable radiation. An image, formed in a coating according to the present invention, may be revealed using an acidified aqueous developer. An intended use of these photoimageable polyimides is the precise placement of protective, electrically insulating coatings over conductive parts of a printed circuit pattern, followed by imagewise exposure and development to remove the coating from those parts of the circuit that provide points of connection to other circuits or electrical devices. Acidified aqueous developers offer advantages over previously discussed solvent and aqueous alkaline developers by preventing problems of copper corrosion and copper oxide formation. The use of photoimageable, aqueous acid developable polyimides distinguishes coating materials, according to the present invention, from materials using less desirable types of image developer.

More particularly the invention provides a photoimageable, aqueous acid soluble polyimide polymer comprising an anhydride, including a substituted benzophenone nucleus, a diamine reacted with the anhydride to form a photosensitive polymer intermediate, and at least 60 Mole % of solubilizing amine reacted with the photosensitive polymer intermediate to form the photoimageable, aqueous acid soluble polyimide polymer. An emulsion for electrophoretic deposition of a coating of a photoimageable, aqueous acid soluble polyimide polymer comprises a dispersed phase, including the photoimageable aqueous acid soluble polyimide polymer, dissolved in an organic solvent and a dispersion phase including a coalescence promoter and water. The emulsion may be applied, by electrophoretic deposition, to a conductive structure to provide a photoimageable coating on the conductive structure. A method for imaging a photoimageable aqueous acid soluble polyimide polymer applied to a conductive structure, used for connecting electrical or electronic components, comprises the steps of, providing a conductive structure used for connecting electrical and electronic components, and applying a coating to the conductive structure using an electrophoretic coating technique. The coating comprises an anhydride including a substituted benzophenone nucleus, a diamine reacted with the anhydride to form a photosensitive polymer intermediate, and at least 60 Mole % of a solubilizing amine reacted with the photosensitive polymer intermediate. Thereafter, exposing the coating to a pattern of radiation for photocrosslinking exposed parts of the photoimageable aqueous acid soluble polyimide polymer, and applying an aqueous acid developer solution to remove unexposed photoimageable aqueous acid soluble polyimide polymer to reveal a crosslinked polyimide polymer image of the radiation pattern.

Electrophoretic deposition techniques allow relatively precise placement of material on charged surfaces included in an electrolytic cell, operated by direct current. The charged surfaces could include suitably connected printed circuits to induce material placement on individual metal traces of the circuitry. Using electrophoretic deposition techniques, deposition of material occurs predominantly on conductive surfaces. This facilitates the coating of unsupported leads and relatively inaccessible portions of a printed circuit such as conductive traces disposed within the structure of a multilayer circuit. Traditional coating methods do not provide desirable protection for such features. In addition, precision coating via electrophoretic deposition techniques uses less material than traditional coating methods thereby providing beneficial cost savings and waste reduction. The selective placing of electrophoretically deposited films provides an added advantage, for coating flexible printed circuits, compared to blanketing layers produced with conventional coating methods. Regardless of differences in coefficient of thermal expansion, selectively deposited coatings cannot exert a force to distort the general shape of the flexible substrate material. Flexible circuits, coated using electrophoretic deposition, are lighter and less likely to exhibit cure-stress-induced curl after processing. Lower circuit weight is important for certain applications, such as interconnects for hard disk drives.

Definitions

For clarification, the following definitions provide the meaning of terms that may be used throughout this specification.

The term "covercoat" refers to a dielectric coating, over the basestock, applied after the conductive pattern has been etched. The basestock may be a conventional printed circuit substrate, including flexible polyimide sheet, used as a support for etched metal patterns, particularly those formed by etching copper.

The term "current density" means the amount of current flowing through a substrate, per unit area, perpendicular to the direction of current flow.

The term "e-coat" is synonymous with electrophoretic deposition and may refer herein to a coating, and technique for electrophoretically depositing such a coating.

The terms "emulsion" and "solution" are used somewhat interchangeably to refer to polyimide containing fluids that may be understood as conventional emulsions except when suspended particles become so small that the liquid is essentially clear with little or no evidence of turbidity, i.e. its visual appearance is that of a solution. When the "emulsion" used for electrophoretic deposition appears to possess solution-like properties, it is considered as a solution and is so described herein.

The term "unsupported lead" means a conductive trace or lead that spans a void in a substrate or extends over the edge of a substrate and thereby exists in an unsupported condition.

The term "mole % amine" as used herein is based upon the original population of anhydride groups before reaction with a diamine to form a photosensitive polyimde moiety. For example, 60 Mole % of solubilizing amine represents an amount equivalent to 60% of the anhydride groups available in the anhydride starting material.

The "polymer intermediate" refers to a reaction product, of at least two monomers, that has the capability for further reaction with other selected reactants. Anhydrides reacting with diamines, as described herein, produce polymer intermediates for further reaction with solubilizing amines.

The term "solubilizing amine" refers to materials containing amine functionality that may react with polymer intermediates to increase polymer solubility in solutions of aqueous acid.

The term "aqueous acid soluble polymer" refers to a polymer that is at least partially soluble in aqueous acid solutions.

The term "aqueous acid developable polymer" refers to a photoimageable, aqueous acid soluble polymer crosslinked by exposure to suitable radiation so that crosslinked material no longer dissolves in dilute aqueous acid. This allows dissolution of unexposed material to leave an insoluble pattern of crosslinked material corresponding to the pattern of radiation used for exposure.

DETAILED DESCRIPTION OF THE INVENTION

The present invention provides modified photoimageable polyimide materials, having solubility in mildly acidic aqueous solutions. These materials are suitable as electrically insulating protective layers for delicate, fragile conductive traces of the type produced by etching copper layers to form printed circuits.

Figure 1:
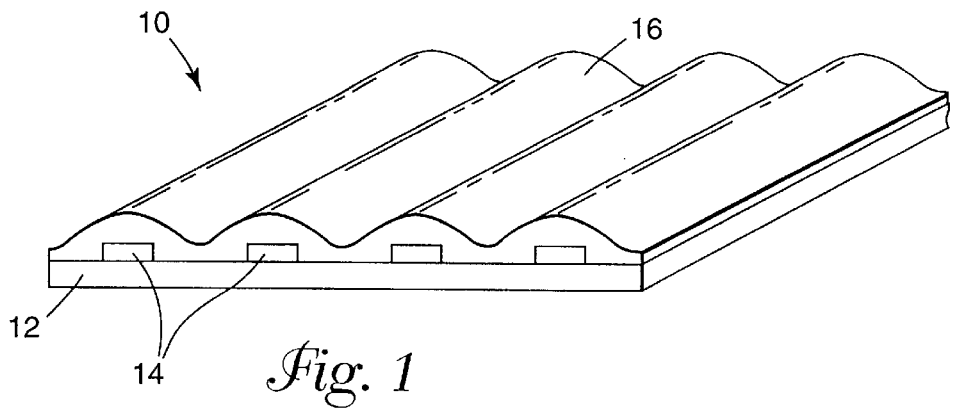
FIG. 1 provides a perspective end view of a section of printed circuit wherein conductive traces have a conventional protective coating.

Referring now to the drawings, wherein like parts have like identifying numerals throughout the several views, FIG. 1 depicts a section 10 from a printed circuit. The section 10 includes a substrate 12 supporting a plurality of conductive traces 14. A coating 16 protects the conductive traces 14 from environmental contaminants and, at the same time, electrically insulates the traces 14 from one another. The coating 16 covers, as a covercoat, the surfaces of both the conductive traces 14 and the substrate 12 between the traces 14. A covercoat of this type results from the use of conventional coating techniques, such as dipping, extrusion coating or spray coating.

Figure 2:
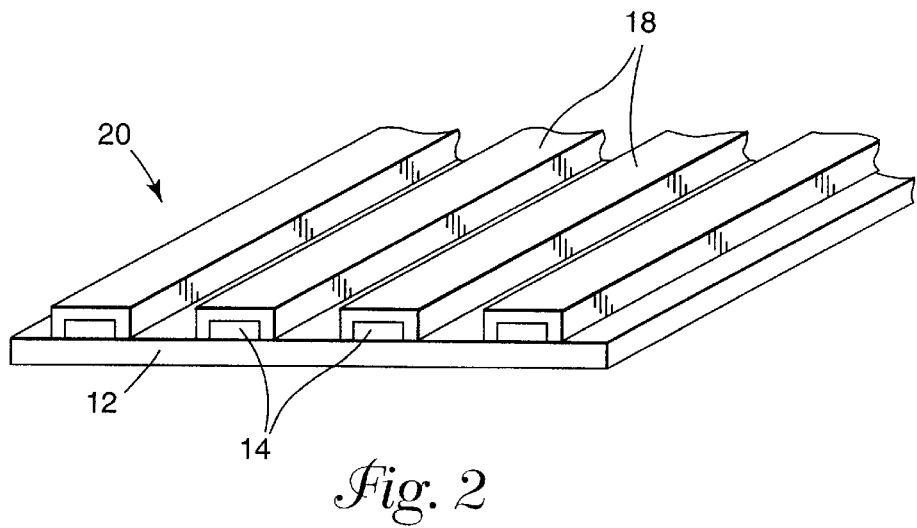
FIG. 2 provides a perspective end view of a section of printed circuit wherein conductive traces have a protective coating according to the present FIG. 3 provides a perspective end view of a section of printed circuit wherein conductive traces have a protective coating according to the present invention and the conductive traces include an unsupported lead.

The section of printed circuit 20 of FIG. 2 differs from that of FIG. 1 by illustrating a photoimageable coating 18 which covers individual conductive traces 14 with an essentially uniform layer of protective, insulating material according to the present invention. The use of an electrophoretic deposition coating technique limits the photoimageable coating 18 to the conductive traces 14 leaving the substrate 12 between the traces 14 substantially free of coating material.

Figure 3:
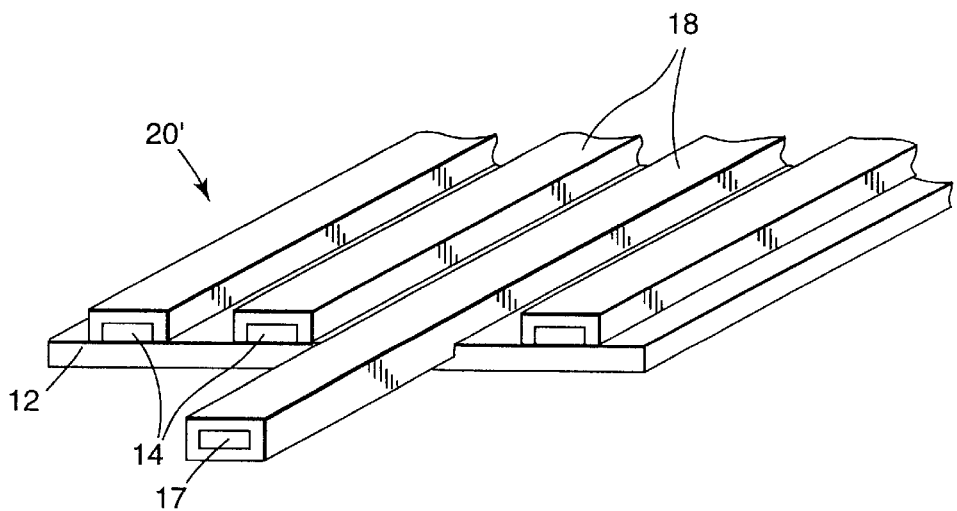

FIG. 3 shows a section 20' of printed circuit that includes an unsupported lead 17 as an extension of one of the conductive traces 14 that projects beyond the edge of the substrate 12. Such unsupported leads 17, although fragile, are common in complex printed circuits used for interconnection of electronic devices. Protection and insulation of unsupported leads, is difficult to accomplish using conventional coating techniques. The use of electrophoretic deposition techniques simplifies the task, by producing a uniform layer over the entire surface of the unsupported lead portion 17 of one of the conductive traces 14.

An aqueous acid developable photoimageable polyimide, according to the present invention, may be prepared by reacting a suitable anhydride molecule, containing a substituted benzophenone nucleus, with an aromatic diamine to form a photosensitive polymer intermediate which becomes aqueous acid soluble upon reaction with a solubilizing amine.

Suitable anhydrides are usually substituted benzophenone dianhydrides and related structures including: benzophenone-tetracarboxylic dianhydride; anthraquinone-tetracarboxylic dianhydride; fluorenone-tetracarboxylic dianhydride; thioxanthone-tetracarboxylic dianhydride. Mixed anhydrides may be used with optional anhydrides providing up to 25% of the total anhydride content. Optional anhydrides include: biphenyl-tetracarboxylic dianhydride; 3,3'diphenylsulfone-tetracarboxylic dianhydride; 4,4'oxydiphthalic anhydride; 2,2'-bis(3,4-dicarboxyphenyl) hexafluoropropane; and bis-dicarboxyphenyl sulfide.

Suitable aromatic diamines include: tetramethylphenylene diamine; 4,4'methylene-bis(2-methylaniline); 4,4'methylene-bis(2-ethylaniline); 4,4'methylene-bis(2-dimethylaniline); 4,4'methylene-bis(2-diethylaniline); dimethylphenylenediamine; trimethylphenylenediamine; 2,4-dimethyl-1,5-phenylenediamine; and 2,4,5-trimethyl-1,3-phenylenediamine. Diamine mixtures may contain up to 25% of optional diamines including: 1,4-bis(4-aminophenoxy)benzene; 4,4'-oxydianiline; 2,2'-bis(4-aminophenyl) hexafluoropropane; 4,4'-methylenedianiline and terminal difunctional amino-siloxanes.

The polyimide materials become image forming upon exposure to patterns of radiation, usually ultraviolet radiation. The solubility of these polyimides in dilute solutions of weak acid, before exposure, provides a way to develop the image patterns. Amine functionality incorporated into the polyimide structure improves the solubility of the resulting polymers in aqueous solutions of weak acids. The amine functionality should be present at a molar concentration preferably of about 60 Mole %, or greater, to offer acid developability in 0.2–0.5% aqueous acetic acid. Preferably the soluble polymer is a reaction product containing at least about 60 Mole % to about 70 Mole % of an effective amine.

Aqueous acid solubility of polymers according to the present invention may also be a function of the molecular weight of the product of the reaction of a polymer intermediate and a solubilizing amine. Photoimageable aqueous acid soluble polymers exist in the molecular weight range from about 20,000 to about 300,000 and preferably from about 50,000 to about 150,000 with a molecular weight distribution (Mw/Mn) from about 1.1 to 3.5, preferably from about 1.5 to 3.0.

Solubilizing amines suitable for imparting polyimide solubility in aqueous acid solutions include: 1-methylpiperazine, 1,-(N,N-dimethylamino)-3-(N'-methylamino) propane (N,N,N'-trimethyl-ethylenediamine), 2-(dimethylamino)morpholine, 3-(dimethylamino) piperidine, 1-methyl-4-(2-methylamino-ethyl)piperazine, bis-2-dimethylaminoethyl(N,N,N',N',-tetramethyldiethylenetriamine), N,N-dimethylethylenediamine, 1-hydroxymethylpiperazine, 1-hydroxyethylpiperazine, N,N-dimethylamino-ethanol, and 3-dimethylaminopropylamine, with 1-methylpiperazine being particularly preferred.

Aqueous acid solutions, suitable for developing the polymeric compositions, may be selected from acetic acid, ethoxyacetic acid, propionic acid, butyric acid, lactic acid, glycolic acid, formic acid and succinic acid and mixtures thereof.

The invention also includes a method for applying coatings of photoimageable polyimide compositions, preferably by electrophoretic deposition of material onto conductive surfaces. Electrophoretic deposition occurs by migration of charged particles or droplets present in the electrolyte of an electrochemical cell. Application of a potential difference to the cell causes charged particles to migrate to the electrode of opposite charge where charge neutralization, on the conductive surface, causes material to deposit and coat the electrode. Electrophoretic coating, according to the present invention, requires the application of direct current and coating deposition at the negatively charged electrode, or cathode. Specifically, the polymer is deposited from an emulsion or solution bath containing some amount of solvent soluble polymer dispersed in an aqueous dispersion phase. As discussed herein, electrophoretically depositable emulsions or solutions include a polyimide composition dispersed in an appropriate medium or carrier. The carrier comprises water and a coalescing solvent. With current flowing between electrodes immersed in the solution or emulsion bath, particles or droplets of the dispersed phase begin preferential migration towards the electrode of opposite charge.

Control of current density and voltage is important for electrophoretic deposition coatings to promote adhesion and prevent the formation of porous coatings. An appropriate current density is in the range of about 0.6 mA/cm$^2$ to about 5.0 mA/cm$^2$. Preferably the current density range is from about 0.8 mA/cm$^2$ to about 1.5 mA/cm$^2$. The applied potential difference or voltage bias may be between about 10 volts and about 100 volts. Preferably, the applied voltage is between about 20 volts and about 50 volts. For this range of voltages a suitable power supply is a Hewlett Packard 6633A System DC Power Supply with a maximum voltage of 50 volts and a maximum current of 2 amps. As used herein the term "current density" means the amount of current flowing through a substrate, per unit area, perpendicular to the direction of current flow.

Coated film thickness and quality depends upon the e-coat formulation, voltage, current density, and the duration of the applied current. The electrophoretic deposition process should be limited to a few minutes. Times from about 1 minute to about 3 minutes are acceptable, but longer coating times may result in films possibly contaminated with acid residues sufficient to cause corrosion at the electrode surface. Such attack could damage a copper printed circuit trace functioning as an electrode for electrophoretic deposition. Other factors that affect electrophoretically deposited coating thickness include solid content of the emulsion, emulsion particle size, conductivity of the emulsion and pH.

Polyimide coating formulations, according to the present invention, include solutions but preferably comprise oil in water emulsions having an average dispersed phase particle size preferably from about 0.002 $\mu$m to about 20 $\mu$m in diameter and even more preferably less than about 2 $\mu$m in diameter. Such emulsions may be prepared by dissolving the polymer in an organic solvent such as N-methylpyrrolidone, $\gamma$-butyrolactone, dimethylformamide or the like, adding an acid and a coalescing solvent and adding water. Emulsion preparation involves the use of a high-speed blender with acid neutralization for improved stability. Suitable neutralizing acids include lactic or acetic acid. Emulsions of the present invention exhibit shelf life and effective performance for periods of at least eight months and usually more than one year without agitation.

Electrophoretically deposited coatings of these emulsions contain coalescence promoters which cause coating coalescence immediately after the electrophoretic deposition process. The process also provides excellent edge coverage that could result in uniform coverage of connecting leads, both supported and unsupported, used as current carriers in printed circuits and related structures. Coalescence promoters include n-butyl-cellosolve, propylene glycol monomethyl ether, propylene glycol ethyl ether acetate, propylene glycol methyl ether, propylene glycol n-butyl ether, propylene glycol n-propyl ether, propylene glycol phenyl ether, dipropylene glycol, propylene glycol, propylene carbonate, propylene glycol ethyl ether, propylene glycol methyl ether acetate, ethylene glycol monomethyl ether, butylene glycol, diethylene glycol, diethylene glycol ethyl ether, ethoxyethanol, ethoxy ethanol acetate, ethylene glycol, triethylene glycol, ethylene glycol diacetate, ethylene glycol propyl ether, methoxy ethanol acetate, methoxy ethanol, phenoxy ethanol, n-butanol, di(ethylene glycol) butyl ether, 2-ethyl hexanol, acetophenone, toluene, propylene glycol methyl ether acetate, and selected mixtures thereof, with n-butyl-cellosolve being preferred.

After drying an electrophoretically deposited coating at approximately 85° C., an image may be formed by exposing the coating to an pattern of ultraviolet radiation. The photoimaging process occurs via crosslinking exposed areas of the polyimide layer using a photo-mask between the coating and a broadband ultraviolet lamp. Photoimaged, crosslinked polyimide no longer dissolves in dilute aqueous acid solution. Image patterns, corresponding to the photo-mask, may be developed by dipping the imaged coating in a solution containing from about 0.1% to about 0.5% of acetic acid in water. This removes the unexposed, non-crosslinked polyimide that is still soluble in aqueous acid. After acid development, followed by rinsing with tetramethylammonium hydroxide solution and deionized water, the developed image, corresponding to the pattern of ultraviolet radiation, may be fixed by curing at least about 300° C., preferably at least about 350° C., in a nitrogen filled oven. The heating rate and dwell time at the image curing temperature require relatively careful control. A positive nitrogen pressure prevents oxidation of the imaged film during curing. The use of a slow rate of heating, to the final curing temperature, allows volatile products to escape before the polyimide cures fully.

A controlled heating rate also prevents foaming and film delamination. Generally cured polyimide films, as covercoats on flexible circuits, exhibit good adhesion (ASTM D3359), hardness of about 3H pencil hardness (ASTM D3363), without cracking, during bending at a radius of 0.3 mm, and less curl compared to conventional epoxy acrylate covercoats.

Aqueous acetic acid development provided images with lines of ±25 microns (±1 mil) resolution. Electrophoretically deposited coatings from about 1.0 μm to about 15.0 μm provide this level of image definition. Preliminary work with spray development suggests a reduction in the amount of time to develop films thicker than 15.0 μm. Spray development offers advantages over dip development. The use of aqueous acid developers is convenient and environmentally beneficial compared to solvent-based developers which require disposal, after use, in compliance with environmental regulations. Photoimageable polyimides, according to the present invention, may be developed, after exposure, with a 2:1 volume ratio of N-methyl pyrrolidone:methyl alcohol, but this mixture is much less environmentally compatible than the preferred aqueous acid developer.

Electrophoretic deposition of photoimageable polyimides on conductive surfaces should provide a relatively precise approach for covering and protecting fragile leads, i.e. unsupported leads, used for electrical interconnection in high density printed circuits including flexible circuits. Photoimageable polyimide materials, applied in this way, have potential application as barrier coatings to provide abrasion resistance and electrically insulating protective layers for product applications in areas such as integrated circuit packaging (ICP), ink jet printers, hard disk drives, medical and biomedical equipment and automotive applications.

Experimental

Preparation of Photosensitive Polyimides

Dianhydride and diamine monomers were added to a nitrogen-filled 500 ml flask. A quantity of 1-methyl-2-pyrrolidinone (NMP) was added to the flask with stirring to produce a solution of monomers in NMP. The resulting viscous solution was maintained under nitrogen with stirring for sixteen hours. After cooling the solution to 0° C., using an ice-bath around the flask, a solution containing 1,3 dicyclohexylcarbodiimide in NMP was added dropwise. During the addition, the color of the solution adopted a dark reddish color, typical of polyisoimide polymers. Upon completion of this addition, the flask and contents were allowed to warm up to room temperature and stirring continued for a further extended period of approximately fifteen hours. Upon addition of 1-methyl piperazine, there was evidence of an exotherm and, within about fifteen minutes, the solution changed color, from dark red to light pink.

The contents of the flask were stirred under nitrogen for a further six hours then filtered into approximately three liters of an alcohol and water mixture containing 1 part of methyl alcohol to 2 parts of water. A pink colored solid formed as a precipitate in the alcohol and water solution. This was isolated by filtration and dried under vacuum at room temperature.

This method was used for preparation of Examples 1 and 2 shown in Table 1.

TABLE 1

Photoimageable Polyimide Compositions

|  | Example 1 | Example 2 |
| --- | --- | --- |
| BTDA | 10.58 g (32.8 mmol) | 33.22 g (103.0 mmol) |
| MBDMA |  | 13.13 g (51.6 mmol) |
| TMPDA | 5.39 g (32.8 mmol) | 8.45 g (51.4 mmol) |
| NMP | 150 ml | 300 ml |
| DCC | 17.5 g (84.8 mmol) in 100 ml NMP | 51.0 g (248 mmol) in 150 ml NMP |
| Piperazine | 6.7 ml (60 mmol) | 20.6 ml (185 mmol) |
| Mn | 92,000 | 258,000 |
| Mw/Mn | 1.83 | 1.60 |

Key to materials:
BTDA is 3,3',4,4'-benzophenone tetracarboxylic dianhydride
MBDMA is 4,4'-methylene-bis(2,6-dimethylaniline)
TMPDA is 2,3,5,6-tetramethylphenylene diamine
NMP is anhydrous 1-methyl-2-pyrrolidinone
DCC is 1,3-dicyclohexylcarbodiimide
Piperazine is 1-methyl piperazine

Emulsion Preparation

A quantity of photoimageable polyimide, dissolved in 1-methyl-2-pyrrolidinone (NMP) was stirred at 1000 rpm, using a Dispermat® FE Laboratory Dissolver from VMA-GETZMANN. After dropwise addition of lactic acid and butyl cellosolve, the stirring speed was increased to 5000 rpm. Water was added dropwise to the rapidly stirring solution until the emulsion phase inverted from water in solvent to solvent tin water. An additional quantity of water was added and the emulsion was kept stirring for 2–3 minutes. Finally, the fluid composition was filtered through a 1.0 μm filter into a 4 oz. wide-mouth jar for storage.

Cathodic Electrophoretic Deposition of Photoimageable Coatings on Copper

Emulsion samples were placed in the reservoir of an electrochemical cell having a cathode, in the form of a copper layer on a flexible polyimide substrate, and a platinized anode separated from the cathode by a fixed distance. A Hewlett Packard, 6633A DC power supply was connected to the electrodes. The maximum voltage bias and current density settings were selected. Polyimide deposition, under the selected conditions, continued for about two minutes before the cathode was removed from the emulsion to be rinsed with deionized (DI) water, from a spray bottle, then immersed in dilute, 0.1N tetramethylammonium hydroxide (TMAH) solution for about two seconds. After a final rinse with deionized water, the sample was dried in a conventional oven controlled at 85° C. for 15 minutes. The deposition process produced a smooth polymer film on the surface of the cathode.

TABLE 2

Coating Formulations and Conditions for Electrophoretic Deposition

|  | Coating Formulation 1 | Coating Formulation 2 |
| --- | --- | --- |
| Polyimide | Example 1–3.5 g | Example 2–4.66 g |
| NMP | 14 g | 18.6 g |
| 85% solution of Lactic acid | 0.92 ml | 0.62 ml |
| Butyl cellosolve | 10 ml | 13.8 ml |
| Water | 65 ml | 78.4 ml |
| pH | 4.46 | 5.80 |
| Conductivity (μS) | 1330 | 780 |

TABLE 2-continued

Coating Formulations and Conditions for Electrophoretic Deposition

|  | Coating Formulation 1 | Coating Formulation 2 |
|---|---|---|
| Electrode separation | 3.0 cm | 4.0 cm |
| Voltage bias | 50 V | 20 V |
| Current density | 1 mA/cm$^2$ | 1 mA/cm$^2$ |
| Time of deposition | 2 minutes | 2 minutes |
| Drying time at 85° C. | 15 minutes | 10 minutes |

Image Formation and Development

A copper substrate, coated with a 6 μm thick layer of the polymer of Example 1, was exposed, through a mask, to a wide spectrum ultraviolet radiation source (available from Hybrid Technology Group-Model #LS66-10X-220/254 UV Lamp). The intensity of exposure was approximately 30 mW/cm$^2$ for about 40 seconds (1200 mJ/cm$^2$).

The exposed layer was developed in a 0.1% solution of aqueous acetic acid for about 30–40 seconds followed by rinsing with water, tetramethylammonium hydroxide (TMAH) solution, and a second water rinse before drying and baking the developed coating. The baking or thermal curing of imaged samples took place in a nitrogen filled oven according to a thermal profile that included 2 hours at 260° C., then 0.5 hour at 300° C. and a final bake step of 5 minutes at 350° C. Image resolution of about 25 μm (1 mil) was observed following this process.

Using essentially the same process, under the following conditions, a coating of Example 2 gave an image coating 6 μm thick.

Imaging Conditions:

UV exposed with a mask at 1000 mJ/cm$^2$ dose and developed with 0.2% acetic acid for about 60 seconds seconds followed by rinsing with water, tetramethylammonium hydroxide (TMAH) solution, and a second water rinse before drying and baking the developed coating.

Final Cure:

3° C./min. ramp to 240° C. (2 hrs); 1° C./min ramp to 300° C. (1 hr.) and 1° C./min. to 350° C. (15 min.).

The solubility of modified polyimides, in aqueous acid solutions, may be varied by adjusting the concentration of the reactive amine. Investigation of the relationship between amine content and acid solubility using 1-methyl piperazine indicates the need for a high piperazine content (>60%) for sufficient solubility in aqueous acid solution. Modified polyimides containing less than 60% 1-methyl piperazine have less solubility in aqueous acids making such solutions less effective as image developers.

TABLE 3

Acid solubility data of Polyimides Modified with 1-methyl piperazine*

| Mol. % piperazine group | Solubility in 0.5% Acetic Acid at room temperature. | Solubility in 40% Acetic Acid at 65° C. |
|---|---|---|
| 35% | No | No |
| 55% | No | No |
| 60% | Yes | Yes |
| 67% | Yes | Yes |

*As in Example 1 polymer Mn of about 90,000, Mw/Mn of about 1.8

Studies of emulsions, prepared with the polyimide of Example 1, show changes in pH and conductivity with increasing addition of butyl cellosolve. As shown in Table 4, conductivity decreases and pH appears to increase slightly with butyl cellosolve addition. Conductivity was measured using a Corning PS-17 conductivity meter. The pH was measured using a Corning pH-30 Sensor calibrated with Ricca Chemical Company pH 4 and 7 buffer solutions.

TABLE 4

Variation of pH and Conductivity of Emulsions.

|  | Sample-1 | Sample-2 | Sample-3 | Sample-4 |
|---|---|---|---|---|
| Polyimide of Example 1 | 3.5g | 3.5g | 3.5g | 3.5g |
| Lactic Acid (85%) | 0.92 mL | 0.92 mL | 0.92 mL | 0.92 mL |
| NMP | 14 g | 14 g | 14 g | 14 g |
| Water | 70 mL | 67.5 mL | 65 mL | 65 mL |
| Butyl Cellosolve | 0 | 2.5 mL | 5 mL | 10 mL |
| pH | 4.30 | 4.34 | 4.39 | 4.46 |
| Conductivity (μS) | 1860 | 1720 | 1550 | 1330 |
| Coating Appearance | A | B | B | C |

Key
Coating Appearance A = Foamed coating
Coating Appearance B = Somewhat foamed coating
Coating Appearance C = Fully coalesced coating Emulsions shown in Table 4 appear almost transparent suggesting an emulsion particle size less than the wavelength of visible light (0.4–0.8 μm). The particle size of emulsions of this invention may be below 0.1 μm (100 nm).

A photosensitive, aqueous acid soluble polyimide polymer and related coatings have been described according to the present invention. It will be appreciated by those of skill in the art that, in light of the present disclosure, changes may be made to the embodiments disclosed herein without departing from the spirit and scope of the invention.

What is claimed is:

1. A photoimageable, aqueous acid soluble polyimide polymer comprising:

an anhydride including a substituted benzopbenone nucleus; said anydride being selected from the group consisting of benzophenone-tetracarboxylic dianhydride, anthraquinone-tetracarboxylic dianhydride, fluorenone-tetracarboxylic dianhydride, and thioxanthone-tetracarboxylic dianhydride, said anhydride further including up to about 25 Mole % of an anhydride selected from the group consisting of biphenyl-tetracarboxylic dianhydride, 3,3'diphenylsulfone-tetracarboxylic dianhydride, 4,4'oxydiphthalic anhydride, 2,2'-bis(3,4-dicarboxyphenyl)hexafluoropropane, and bis-dicarboxyphenyl sulfide, a diamine reacted with said anhydride to form a photosensitive polymer intermediate; and at least 60 Mole % of a solubilizing amine reacted with said photosensitive polymer intermediate to form said photoimageable, aqueous acid soluble polyimide polymer.

2. A photoimageable, aqueous acid soluble polyimide polymer comprising:

an anhydride including a substituted benzophenone nucleus;

a diamine reacted with said anhydride to form a photosensitive polymer intermediate; said diamine being an aromatic diamine selected from the group consisting of tetramethylphenylene diamine, 4,4'methylene-bis(2-methylaniline), 4,4'methylene-bis(2-ethylaniline), 4,4'methylene-bis(2,6-dimethylaniline), 4,4'methylene-bis(2,6-diethylaniline), dimethylphenylenediamine, trimethylphenylenediamine, 2,4-dimethyl-1,5-phenylenediamine, and 2,4,5-trimethyl-1,3-phenylenediamine, and at least 60 Mole % of a solubilizing amine reacted with said photosensitive polymer intermediate to form said photoimageable, aqueous acid soluble polyimide polymer.

3. A photoimageable, aqueous acid soluble polyimide polymer according to claim 2, wherein said diamine further includes up to about 25 Mole % of an amine selected from, the group consisting of 1,4-bis(4-aminophenoxy)benzene, 4,4'-oxydianiline, 2,2'-bis(4-aminophenyl) hexafluoropropane, 4,4'-methylenedianiline and terminal difunctional amino-siloxanes.

* * * * *